United States Patent
Di-Giacomo

(10) Patent No.: US 9,212,053 B2
(45) Date of Patent: Dec. 15, 2015

(54) PROCESS FOR PRODUCING A METAL DEVICE HOUSED IN A CLOSED HOUSING WITHIN AN INTEGRATED CIRCUIT, AND CORRESPONDING INTEGRATED CIRCUIT

(71) Applicant: STMicroelectronics (Rousset) SAS, Rousset (FR)

(72) Inventor: Antonio Di-Giacomo, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/675,349

(22) Filed: Mar. 31, 2015

(65) Prior Publication Data

US 2015/0203349 A1  Jul. 23, 2015

Related U.S. Application Data

(62) Division of application No. 14/148,884, filed on Jan. 7, 2014, now Pat. No. 9,006,897.

(30) Foreign Application Priority Data

Jan. 9, 2013 (FR) ..................... 13 50161

(51) Int. Cl.
*H01L 21/00* (2006.01)
*H01L 21/4763* (2006.01)
*B81C 1/00* (2006.01)
*H01L 23/528* (2006.01)
*H05K 7/02* (2006.01)

(52) U.S. Cl.
CPC .......... *B81C 1/00246* (2013.01); *H01L 23/528* (2013.01); *H05K 7/02* (2013.01); *B81B 2207/015* (2013.01); *B81B 2207/07* (2013.01); *B81B 2207/098* (2013.01); *B81C 2203/0136* (2013.01); *B81C 2203/0145* (2013.01); *B81C 2203/0714* (2013.01); *B81C 2203/0735* (2013.01); *H01L 2924/0002* (2013.01)

(58) Field of Classification Search
CPC .......................... H01L 21/383; H01L 23/528
USPC .......................... 438/50, 319, 411, 619, 622; 257/E23.141
See application file for complete search history.

(56) References Cited

U.S. PATENT DOCUMENTS

| | | | | |
|---|---|---|---|---|
| 4,628,283 A | * | 12/1986 | Reynolds | H01P 7/10 257/418 |
| 6,208,233 B1 | * | 3/2001 | Stein, Sr. | G01L 19/0084 338/195 |
| 8,310,053 B2 | | 11/2012 | Verheijden et al. | |

(Continued)

OTHER PUBLICATIONS

French Search Report received in Application No. 1350161 mailed Sep. 27, 2013, 8 pages.

*Primary Examiner* — Nitin Parekh
(74) *Attorney, Agent, or Firm* — Slater & Matsil, LLP

(57) ABSTRACT

An integrated circuit includes a number of metallization levels separated by an insulating region disposed over a substrate. A housing includes walls formed from metal portions produced in various metallization levels. A metal device is housed in the housing. An aperture is produced in at least one wall of the housing. An external mechanism outside of the housing is configured so as to form an obstacle to diffusion of a fluid out of the housing through the at least one aperture. At least one through-metallization passes through the external mechanism and penetrates into the housing through the aperture in order to make contact with at least one element of the metal device.

23 Claims, 9 Drawing Sheets

(56) References Cited

U.S. PATENT DOCUMENTS

| | | |
|---|---|---|
| 8,313,970 B2 | 11/2012 | Quevy et al. |
| 8,912,031 B2 * | 12/2014 | Kanemoto .......... B81C 1/00801 438/125 |
| 2004/0035205 A1 * | 2/2004 | Rodgers ................ B81B 7/0012 73/514.18 |
| 2007/0262401 A1 | 11/2007 | Yokoyama et al. |
| 2008/0093691 A1 | 4/2008 | Busta |
| 2008/0224241 A1 | 9/2008 | Inaba et al. |
| 2008/0227286 A1 | 9/2008 | Gaillard |
| 2010/0178717 A1 * | 7/2010 | Kihara ................ H03H 3/0077 438/10 |
| 2011/0037132 A1 | 2/2011 | Hsu et al. |
| 2011/0037160 A1 * | 2/2011 | Hsu ...................... B81C 1/00246 257/690 |
| 2011/0089521 A1 * | 4/2011 | Sato ..................... B81C 1/00246 257/484 |
| 2011/0121412 A1 | 5/2011 | Quevy et al. |
| 2011/0147859 A1 | 6/2011 | Tanaka et al. |
| 2012/0134121 A1 | 5/2012 | Kanemoto et al. |
| 2013/0140655 A1 * | 6/2013 | Yeh ........................ H01L 21/56 257/416 |
| 2013/0193529 A1 | 8/2013 | Burchard |
| 2013/0341738 A1 * | 12/2013 | Reinmuth ............... B81B 7/007 257/415 |

* cited by examiner

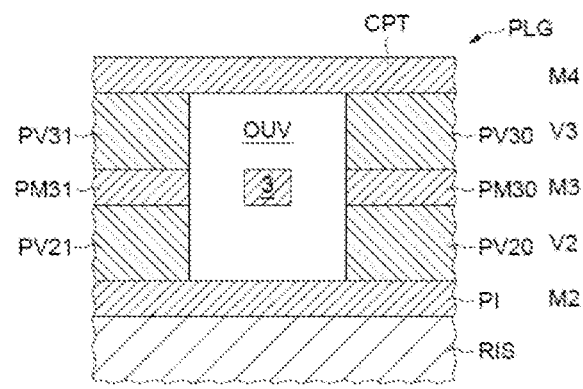
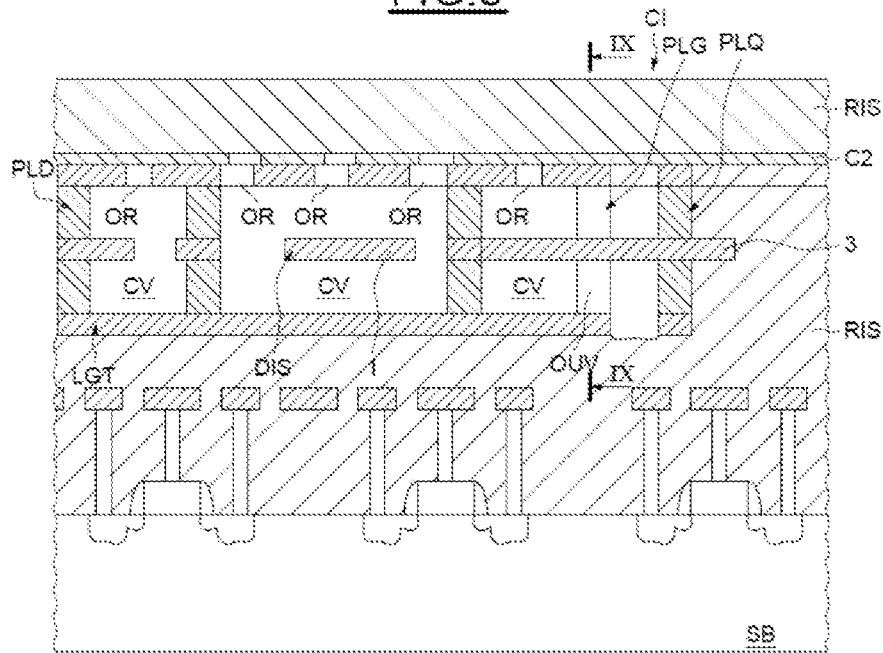

PROCESS FOR PRODUCING A METAL DEVICE HOUSED IN A CLOSED HOUSING WITHIN AN INTEGRATED CIRCUIT, AND CORRESPONDING INTEGRATED CIRCUIT

This application is a divisional application of U.S. patent application Ser. No. 14/148,884, filed Jan. 7, 2014 (now U.S. Pat. No. 9,006,897), which claims priority to French Patent Application No. 1350161, which was filed Jan. 9, 2013 and is incorporated herein by reference.

TECHNICAL FIELD

The invention relates to integrated circuits and, in particular embodiments, to the production of metal devices housed in closed housings in these integrated circuits. Other embodiments relate to the protection of the environment outside of the housing during production of the device and the housing.

BACKGROUND

Currently, within integrated circuits, micro-electromechanical systems (MEMS) are produced using silicon elements. However, the technology used to produce such devices is a dedicated technology that is difficult to integrate into a standard CMOS technology process flow.

SUMMARY

According to one method of implementation and embodiment, it is proposed to produce a metal device housed in a closed housing in an integrated circuit, which can be produced using any CMOS technology process flow by the optional inclusion of only a few additional operations (addition of a mask level, for example), while simultaneously reducing the risk of degradation of the environment outside of the housing, and this without using conventional MEMS technology.

According to one aspect, a process is provided for producing, within an integrated circuit, a metal device housed in a closed housing at least one wall of which possesses at least one aperture through which at least one through-metallization passes, at a distance from the sides of the aperture, in order to make contact with at least one element of the device.

Specifically, it is generally necessary to make contact with the metal device in order, notably, either to activate it electrically or to detect a state of this device via, for example, reception of a signal. Thus, this is notably achieved using the metallization that passes through the aperture in the wall of the housing.

An integrated circuit also comprises, on a substrate, a part comprising a number of metallization levels separated by an insulating region. Such a part is commonly called the back end of line (BEOL) part, by those skilled in the art.

The process according to this aspect then comprises producing, within the BEOL part, a lower part of the housing, which lower part is filled with the material of the insulating region and contains the device and the through-metallization, both of which are encapsulated in the insulating material, typically one or more silicon oxides.

The process also comprises producing an external mechanism outside of the housing, encapsulated in the material of the insulating region and configured to form an obstacle to diffusion of a fluid out of the housing through the at least one aperture.

The process also comprises closing the filled lower part of the housing with a holed metal cap, removing the insulating material from the housing and de-encapsulating the device and the through-metallization with a fluid penetrating into the housing through the holed cap.

The diffusion of the fluid out of the housing through the at least one aperture is then impeded by the external mechanism.

The process also comprises blocking of the holed cap.

The fluid used to remove the insulating material and to de-encapsulate the device and the metallization part extending into the housing and making contact with the device may be a liquid or a gas. In this respect, a plasma capable of selectively removing the insulating material over the metal walls and metal elements of the device may by all means be used, an acid, for example hydrofluoric acid, then being used to terminate this operation.

Furthermore, the external mechanism, for example a plate or tunnel, allows diffusion of the de-encapsulation fluid out of the housing to be limited in order to minimize the risk of this fluid degrading other parts of the integrated circuit, such as, for example, transistors produced in the vicinity, outside and below the housing.

According to another aspect, an integrated circuit is provided comprising, on a substrate, a part comprising a number of metallization levels separated by an insulating region.

According to one general feature of this other aspect, the integrated circuit furthermore comprises, within the part, a housing the walls of which comprise metal portions produced in various metallization levels, a metal device housed in the housing, at least one aperture produced in at least one wall of the housing (this wall possibly for example being a sidewall or even a bottom wall), an external mechanism outside of the housing configured so as to form an obstacle to diffusion of a fluid out of the housing through the at least one aperture, and at least one through-metallization passing through the external mechanism and penetrating into the housing through the aperture, at a distance away from the edges of the aperture, in order to make contact with at least one element of the metal device.

According to one variant, the external mechanism may comprise a metal plate integral with the at least one through-metallization.

According to one embodiment, the at least one wall in which the at least one aperture is produced extends over at least three metallization levels and two via levels. Such a wall is, for example, a sidewall of the housing. The aperture is bounded, in a first direction, for example the vertical direction, by a first portion of the wall located in the upper metallization level, and by a second wall portion located in the lower metallization level. The aperture is also bounded in a second direction perpendicular to the first direction, for example the horizontal direction, by third and fourth wall portions extending facing each other over the intermediate metallization level and over the two via levels flanking this intermediate metallization level.

The at least one through-metallization then extends in the intermediate metallization level, and the plate extends over the at least three metallization levels and two via levels.

In order to further limit diffusion of the fluid out of the housing, the plate may comprise, in the lower metallization level, a bend in the direction of the wall. The gap between the wall and the plate is then decreased.

According to another embodiment, the external mechanism may furthermore comprise, if the configuration of the integrated circuit permits it, an external metal box integral with the wall, containing the plate and possessing a box aperture, the plate being located between the wall aperture and the box aperture, the at least one through-metallization passing through the box aperture without making contact with the metal walls of the box.

The combination of the plate and the box further impedes diffusion of the de-encapsulation fluid out of the housing.

According to another variant, the external mechanism may comprise a tunnel integral with the wall around the at least one aperture, this tunnel being at least partially filled with the material of the insulating region and through which the at least one through-metallization passes. In fact, during its production, the tunnel is completely filled with insulating material, and if the fluid escapes from the aperture in order to penetrate into the tunnel, a part of the insulating material filling the tunnel may then be etched but the diffusion of the fluid stops by capillary action.

The tunnel may have any geometric shape. It may be rectilinear or even a serpentine, thereby even further slowing diffusion of the fluid.

According to one embodiment, the internal corners of the housing are advantageously bevelled, for example to 45°. This makes it possible to improve the removal of the insulating material in the corners of the housing and the subsequent cleaning of the housing in the corners.

BRIEF DESCRIPTION OF THE DRAWINGS

Other advantages and features of the invention will become apparent on reading the detailed description of nonlimiting methods of implementation and embodiments, and from the appended drawings in which:

FIGS. 1 to 16, essentially schematic, relate to various methods of implementation and embodiments of the invention.

DETAILED DESCRIPTION OF ILLUSTRATIVE EMBODIMENTS

Figure 1:
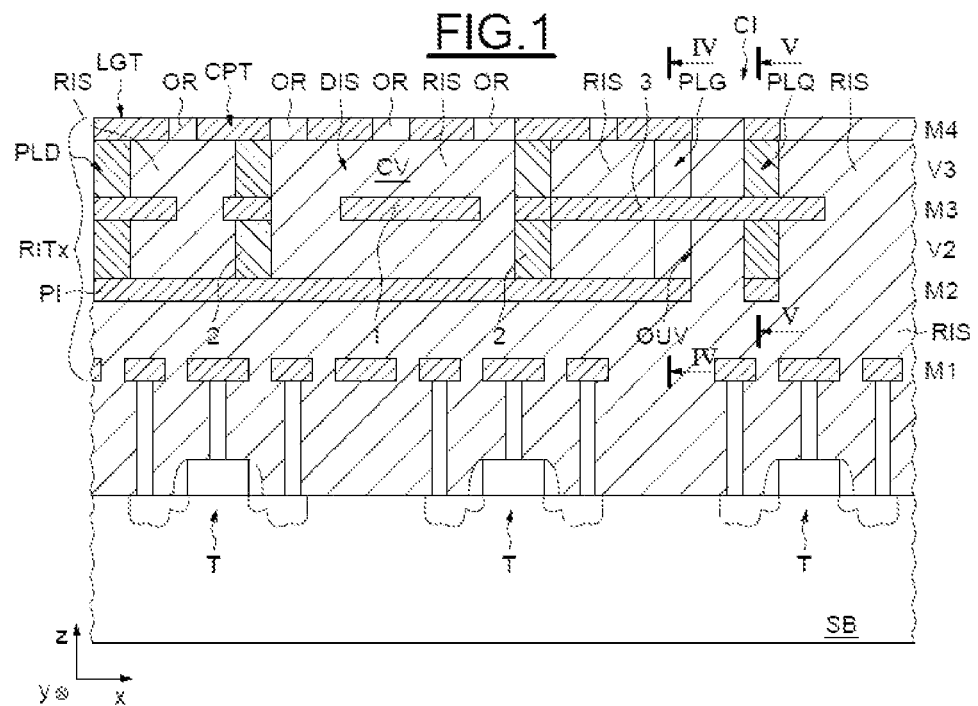

In FIG. 1, the reference CI denotes an integrated circuit in which a metal device DIS housed in a housing LGT is to be produced.

As will be seen in greater detail below, the metal device DIS and the housing LGT are produced in a number of metallization levels (here three metallization levels M2, M3, M4, and two via levels V2, V3) of the interconnect part RITX of the integrated circuit CI. This interconnect part commonly is called the back end of lines (BEOL) part, by those skilled in the art.

This interconnect part is located above the substrate SB of the integrated circuit and above components, such as transistors T, produced in and on the substrate SB.

As is conventional in the art, some of the metal tracks produced in the various metallization levels of the integrated circuit are connected to one another by interconnect holes or vias, all of these tracks and vias being encapsulated in an insulating region RIS, which may be formed from one or more electrically insulating materials.

Figure 2:
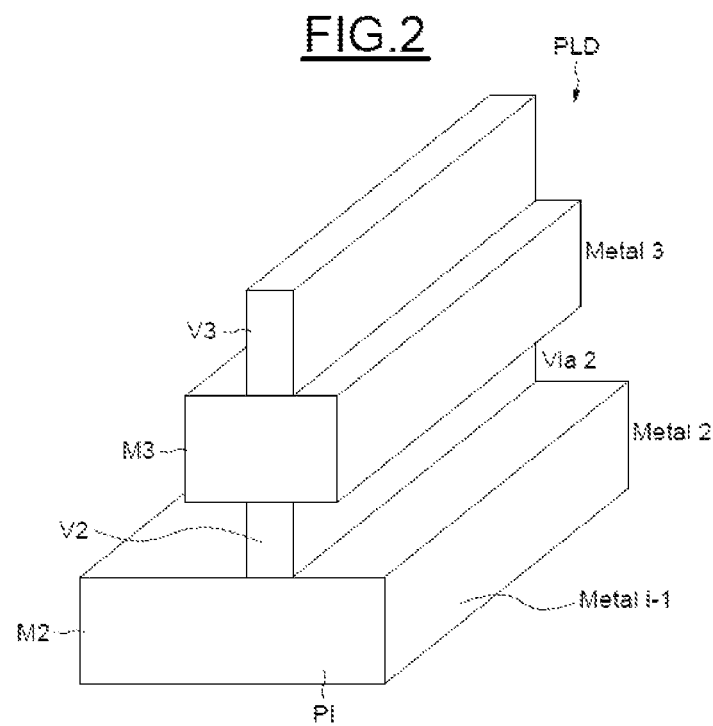

The housing LGT comprises, in FIG. 1, a lower part possessing a bottom wall PI produced in the metal level M2, a sidewall PLD (FIG. 2) produced in the via level V2, in the metal level M3 and in the via level V3, and a wall PLG also produced in the via level V2, in the metal level M3, and in the via level V3. This wall PLG comprises an aperture OUV.

Figure 3:
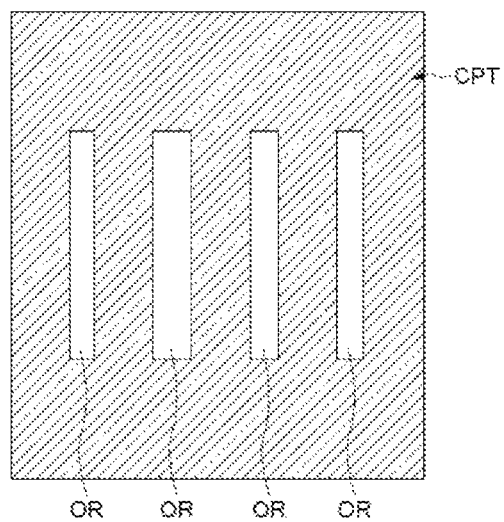

The housing LGT is closed by a holed cap CPT comprising (FIGS. 1 and 3) a number of orifices OR. The cap CPT is produced in the metal level M4.

The device DIS may have any shape and any function. As will be seen in more detail below, the device DIS is initially encapsulated in the insulating material RIS of the interconnect part RITX, and, then, later on, after this material RIS has been removed from the cavity CV of the housing, freed.

In the example described here, the device DIS comprises a metal part produced in the metal level M3, which, after de-encapsulation, will be able to move in the cavity CV of the housing LGT. Here, the device DIS also comprises electrically conductive pillars 2 formed by vias located in the via level V2, by metal portions located in the metal level M3 and by vias located in the via level V3. The metal part 1 is intended, after de-encapsulation, to make contact with two pillars 2, for example in order to detect the orientation or a change in the orientation of the integrated circuit.

Thus, the device DIS may, for example, be a device for detecting the spatial orientation and/or a change in the orientation of an integrated circuit, for example a device such as that described in French patent application No 1 252 988, or even an integrated mechanical electrical switching device such as that described in French patent application No 1 161 407, or even such an integrated mechanical electrical switching device possessing a blocked state, as described in French patent application No 1 161 410, or even an integrated capacitive device having a temperature variable capacitance of the type described in French patent application No 1 161 408.

Generally, at least one metallization 3 is provided, also produced in at least one metal level of the RITX part of the integrated circuit. The metallization 3 passes through the aperture OUV in one wall of the housing, in the current case the wall PLG, in order to make contact with at least one element of the device DIS, in the current case a pillar 2. Such a metallization is used to convey an electrical signal, optionally intended, for example, depending on whether or not it is transmitted to another location of the device DIS, to establish an electrical connection via the device.

Figure 4:
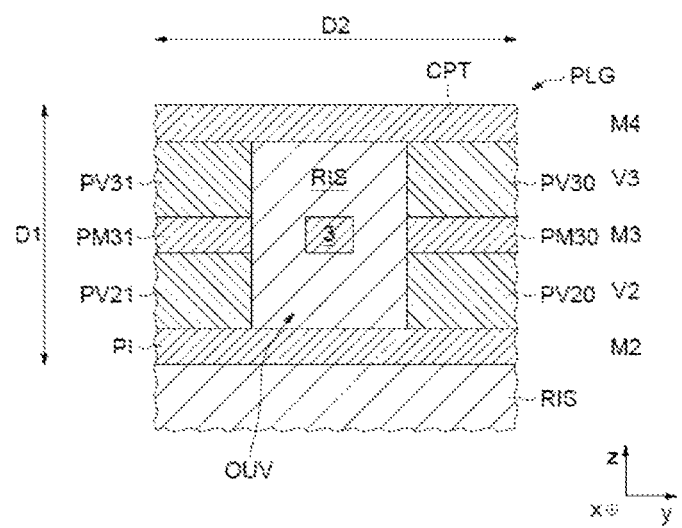

As illustrated in FIG. 4, which is a cross-section along the line IV-IV in FIG. 1, the wall PLG in which the aperture OUV is produced extends, identically to the wall PLD, over the three metallization levels M2, M3 and M4 and the two via levels V2 and V3.

The aperture OUV is bounded in the direction D1 (vertical direction) by a first portion of the wall PLG located in the upper metallization level, in this case a part of the cap CPT, and by a second wall portion located in the lower metallization level (the metal level M2) formed here by a portion of the bottom wall PI.

The aperture OUV is bounded in a second direction perpendicular to the first direction (in this case the horizontal direction) by third and fourth wall portions extending facing each other over the intermediate metallization level M3 and over the two via levels V2 and V3 flanking this intermediate metallization level.

More precisely, the third wall portion comprises a portion PV20 located in the via level V2 surmounted by a metal track portion PM30 surmounted by another portion PV30 located in the via level V3.

Likewise, the fourth wall portion comprises a portion PV21 located in the via level V2 surmounted by another metal track portion PM31 surmounted by a portion PV31 located in the via level V3.

Furthermore, the through-metallization 3 extends in the metallization level M3 while remaining a distance away from the metal portions PM30 and PM31. That is, it remains electrically isolated from the wall PLG.

By way of indication, in the case of a parallelepiped housing LGT, the length of the housing, measured in the x-direction, and its width, measured in the y-direction, may be between 10 and 100 microns whereas the height, which of course depends on the number of metallization and via levels used to produce the housing, may be between 20,000 and 35,000 angstroms.

The height of the aperture OUV, measured in the z-direction, may be between 10,000 and 17,000 angstroms and the gap (measured in the D2 direction) between the metallization 3 and each of the metal portions PM30 and PM31 (FIG. 4) is set by design rules (DRM: design rules manual) and may be between 0.36 microns and 3 microns.

The integrated circuit CI also comprises a metal plate PLQ (FIG. 1 and FIG. 5) integral with the metallization 3. This plate PLQ is placed facing the aperture OUV and therefore extends here over the three metallization levels M2, M3, M4 and the two via levels V2, V3. This being so, this plate could also extend beyond the aperture and therefore extend over additional metallization levels and additional via levels.

Figure 5:
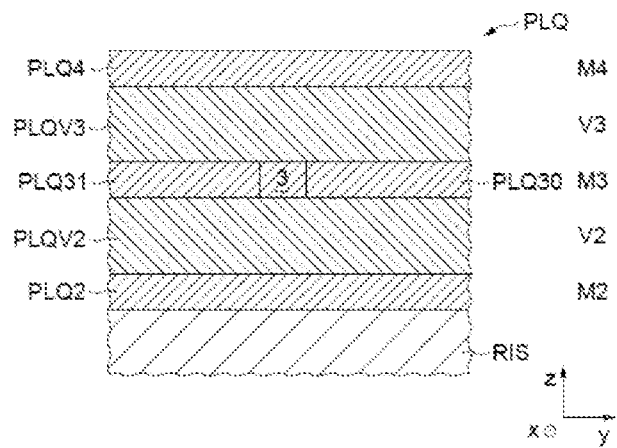

More precisely, as illustrated in FIG. 5, which is a cross section along the line V-V of FIG. 1, the plate PLQ comprises a lower metal portion PLQ2 produced in the metal level M2, a portion PLQV2 produced in the via level V2, and two metal portions PLQ30 and PLQ31 produced in the metallization level M3 and flanking the metallization 3. In practice, the metallization 3 and the portions PLQ30 and PLQ31 form one and the same metal part.

The plate PLQ furthermore comprises a metal portion PLQV3 produced in the via level V3 and lastly a metal portion PLQ4 produced in the metal level M4.

The plate PLQ is located a distance away from the aperture OUV in order not to short-circuit the metallization M3 with the bottom wall PI and the cap CPT.

By way of indication, the thickness of the plate, measured in the x-direction, may range between 0.2 and 1 micron. The space between the aperture OUV and the plate may, for its part, range between 0.12 and 1 micron.

The housing LGT comprising these various walls and the cap, the metal device DIS and the plate PLQ are produced simultaneously and gradually as the various metallization and via levels of the interconnect part RITX are produced.

The steps used to produce the metallization and via levels are conventional steps that may notably be found in standard process flows for fabricating CMOS technologies.

More precisely, after a metal level i-1 and via level i-1 have been produced, the various metal portions of the metal level i are produced in the conventional way by etching the subjacent oxide RIS and depositing metal, for example copper, in the trenches formed.

Next, the assembly is covered with oxide and the metallization level i+1 and the via level i are then produced.

This process is repeated as many times as is necessary to produce the consecutive metallization and via levels.

After the metallization level M4 (FIG. 1) has been produced, the configuration illustrated in FIG. 1, in which the cavity CV of the housing LGT, and likewise the aperture OUV and the space between the wall PLG and the plate PLQ, is filled with an insulating material RIS, is obtained.

Figure 6:
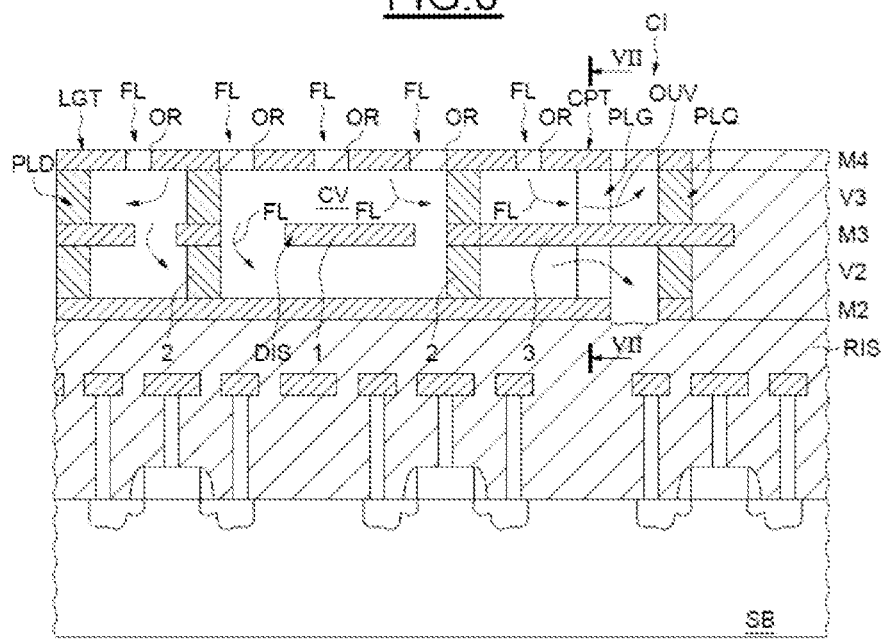

Next, as illustrated in FIG. 6, the insulating material RIS is removed from the housing and the device DIS and the through-metallization 3 are de-encapsulated with a fluid FL that penetrates into the housing via the orifices OR in the holed cap CPT.

The fluid FL also flows out of the housing LGT via the aperture OUV in order to remove the insulating material RIS placed between the wall PLG and the plate PLQ.

The through-metallization 3 then passes through the aperture OUV (FIG. 7, which is a cross section along the line VII-VII in FIG. 6) while remaining a distance away from the sides of this aperture OUV in order to prevent an electrical short-circuit with the wall PLG (FIG. 7).

In contrast, the diffusion of the fluid out of the housing via the aperture OUV is impeded by the external mechanism formed, in this embodiment, by the plate PLQ. This external mechanism PLQ therefore forms an obstacle to diffusion of the fluid FL out of the housing LGT through the aperture OUV and therefore limits the risk of degradation of the environment outside of the housing LGT.

By way of example, the fluid FL may by all means be a plasma used in a dry isotropic etching operation, then, for example, hydrosulphuric acid used in a wet etch.

After this operation of removing the insulating material RIS has allowed the device DIS and, in the present case, the part 1 to be de-encapsulated, the part then being able to move in the cavity CV, the cavity of the housing is cleaned in a conventional way, for example with an aqueous solution.

Figure 9:
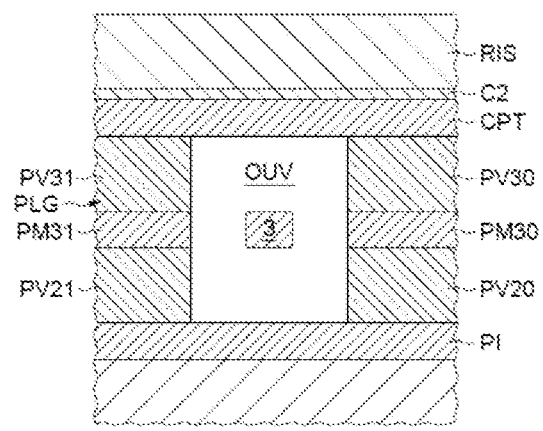

Next, as illustrated in FIG. 8, a layer C2, for example of silicon oxide or nitride, is deposited with the aim of partially blocking the orifices OR. Next, a non-conformal oxide RIS is deposited in order to block the orifices OR and enable the subsequent production of various upper metallization and via levels (FIG. 8, and FIG. 9 which is a cross section along the line IX-IX in FIG. 8). This being so, if the last metallization level has been reached, the layer RIS is replaced by a conventional passivation layer.

The external mechanism forming an obstacle to the diffusion of the fluid FL for de-encapsulating the device DIS may have one of a number of structures.

Figure 10:
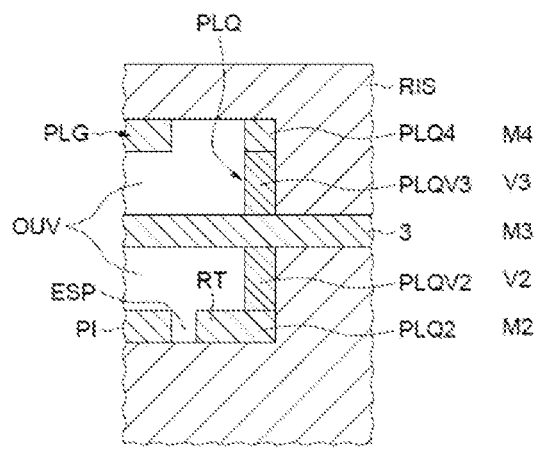

Thus, as illustrated in FIG. 10, the plate PLQ advantageously contains a bend RT in the direction of the wall PLG in which the aperture OUV is produced. Thus, the gap ESP between the bottom wall PI of the housing LGT and the metal portion PLG2 of the plate PLQ is made smaller, thereby even further limiting diffusion of the fluid FL out of the housing LGT, and notably downward.

Figure 11:
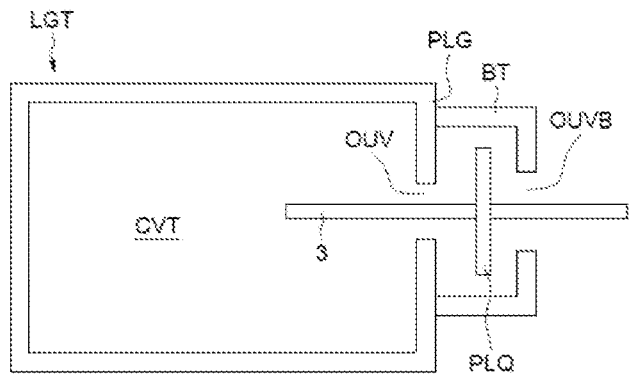

It is also possible, as illustrated in FIG. 11, for the external mechanism forming an obstacle to the diffusion of the fluid FL to furthermore comprise an external metal box BT integral with the wall PLG. This box BT contains the plate PLQ and possesses a box aperture OUVB. The plate PLQ is placed between the wall aperture OUV and the box aperture OUVB and the metallization 3 passes through the box aperture OUVB without making contact with the metal walls of the box BT, once again in order to avoid an electrical short-circuit with the housing LGT.

Figure 12:
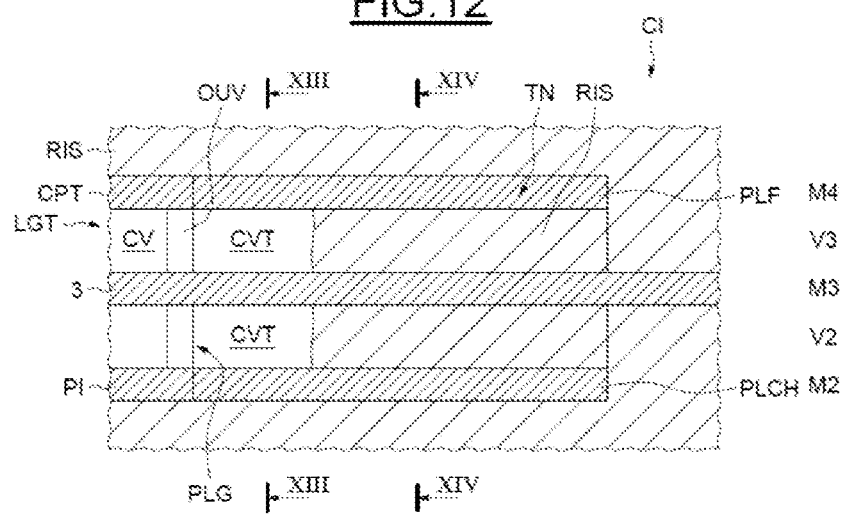
Figure 13:
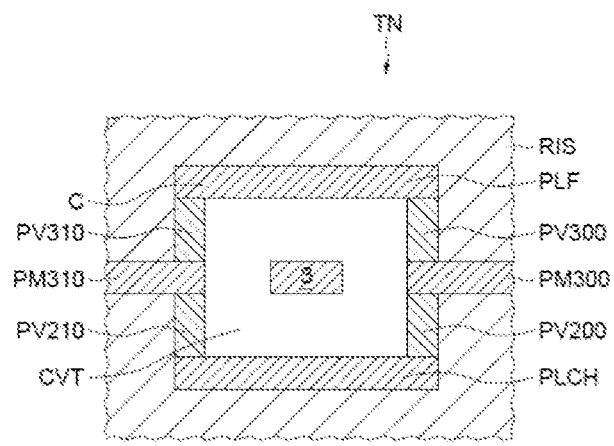
Figure 14:
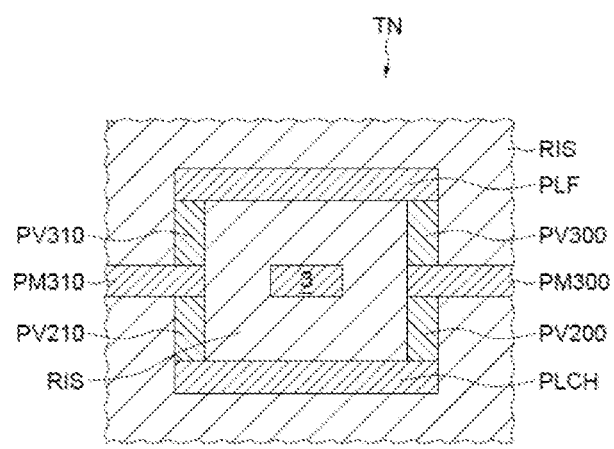

Instead of being a plate, the external mechanism may, as illustrated in FIG. 12, FIG. 13 (which is a cross-sectional view along the line XIII-XIII in FIG. 12) and FIG. 14 (which is a cross-sectional view along the line XIV-XIV in FIG. 12), be a tunnel TN integral with the wall PLG around the aperture OUV.

In the example illustrated here, the tunnel is also produced in the metallization levels M2, M3, M4 and the via levels V2 and V3 and matched to the external dimensions of the aperture OUV. This being so, it could have a larger aperture than the aperture OUV in the wall.

The tunnel TN is, in this example, rectilinear and has a parallelepipedal shape.

The tunnel may have a length in a range between a few microns, for example 2 to 3 microns, and a few tens of microns, for example 15 to 20 microns.

It possesses a top wall PLF located in the metallization level M4, a bottom wall PLCH located in the metallization level M2, and intermediate metal portions PM300 and PM310 located in the metallization level M3, and flanking, at a distance on either side, the through-metallization 3 that passes through the tunnel.

The intermediate metallizations PM310 and PM300 are respectively flanked by metal portions PV310 and PV300, located in the via level V3, and PV210 and PV200, located in the via level V2.

The fluid FL that flows through the aperture OUV during the de-encapsulation of the device DIS will remove some of the insulating material RIS located in the tunnel near the aperture OUV so as to form a cavity CVT. The fluid is then stopped by capillary action and the rest of the tunnel remains filled with the insulating material RIS.

It may be seen that the use of a tunnel TN integral with the wall around the aperture OUV provides effective protection of the integrated circuit environment outside of the housing LGT.

This being so, it is preferable, in certain applications, for the tunnel to be a short rectilinear part connected to the wall and extended by an extension at 90° running parallel to the wall. Thus possible thermal expansion of the metallization passing through the tunnel and making contact with the metal device will have a negligible impact on a metal device actuated by a temperature variation.

Figure 15:
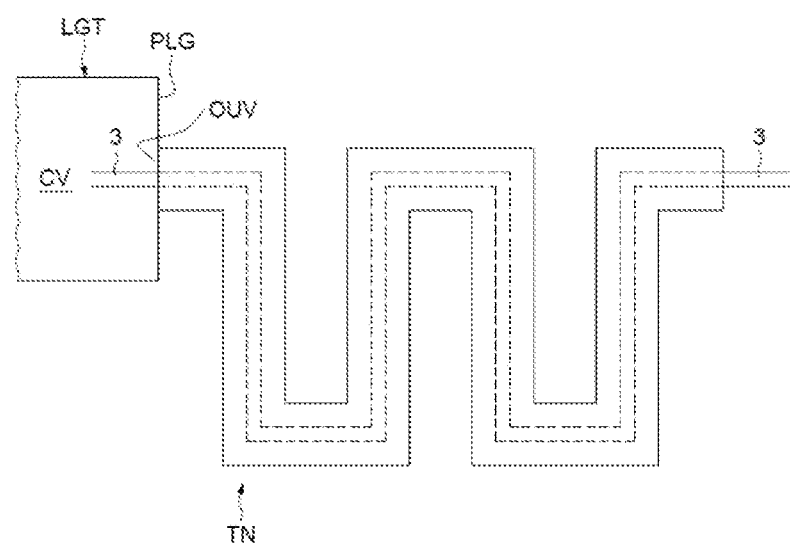

In order to further break the diffusion of the fluid FL out of the housing LGT through the aperture OUV, the tunnel TN may have, as illustrated in FIG. 15, a serpentine shape. In this case the metallization 3 still passes through the tunnel, but the former then also has a serpentine shape.

Figure 16:
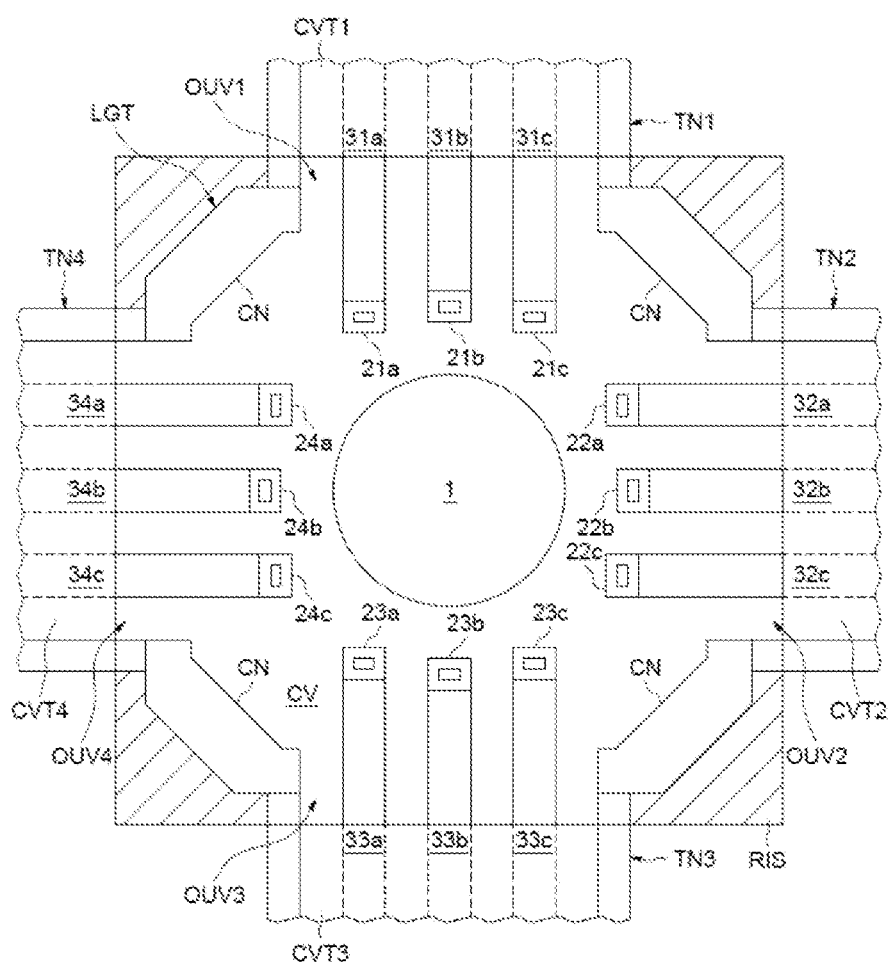

Of course, as illustrated in FIG. 16, the housing LGT may have a plurality of apertures in its walls, here four apertures OUV1-OUV4 respectively produced in four sidewalls of the housing LGT. Each of these apertures allows three metallizations 31a-31c, 32-32c, 33a-33c and 34a-34c to cross into the housing LGT. These metallizations respectively make contact with pillars 21a-21c, 22a-22c, 23a-23c and 24a-24c of the device DIS.

The part 1 of the device able to move in the cavity CV of the housing LGT is therefore capable of making contact with two of the pillars of the device depending on the orientation of the integrated circuit CI in space. The presence of an electrical connection, produced by way of the metal part making contact with two pillars, allows the angle of orientation of the device to be determined.

In order to limit the diffusion of the fluid FL used to de-encapsulate the device, the mechanism forming an obstacle placed facing each of the apertures is here formed by a tunnel TN1-TN4 such as that described with reference to FIGS. 12 to 14.

Of course, at least some of the tunnels could be replaced with plates PLQ of the type described above.

Moreover, in order notably to make removing the insulating material from the cavity CV of the housing LGT easier, the internal corners CN of the housing are bevelled, for example to 45°.

What is claimed is:

1. A method for producing a device, the method comprising:
   providing a substrate with integrated circuit elements disposed at a surface of the substrate;
   forming a housing over the substrate, wherein forming the housing comprises forming a plurality of metallization levels separated by an insulating region, the plurality of metallization levels comprising a first metallization level; and
   forming a metal device within the housing, the housing including a wall with an aperture through which a through-metallization passes in order to make electrical contact to the device within the housing, the metal device formed in a metallization level of the plurality of metallization levels overlying the substrate and the first metallization level.

2. The method of claim 1, wherein forming the housing comprises:
   forming a lower part of the housing that is filled with insulating material of the insulating region and contains the metal device and the through-metallization, both of which are encapsulated in the insulating material;
   closing the lower part of the housing with a holed metal cap; and
   removing the insulating material from the housing with a fluid penetrating into the housing through the holed cap.

3. The method of claim 2, wherein the removing the insulating material from the housing encapsulates the metal device and the through-metallization.

4. The method of claim 2, further comprising forming an external mechanism outside of the housing, wherein removing the insulating material comprises diffusing the fluid out of the housing through an aperture that is impeded by the external mechanism.

5. The method of claim 2, further comprising blocking the holed cap.

6. The method of claim 1, further comprising forming an interconnect structure from the plurality of metallization levels, the interconnect structure interconnecting the integrated circuit elements.

7. A method for producing a device, the method comprising forming a plurality of structured metallization levels overlying a substrate, wherein forming the structured metallization levels includes:
   forming a housing overlying the substrate, the housing including walls formed from metal portions of the metallization levels;
   forming a metal device in the housing;
   forming an aperture in a wall of the housing;
   forming an external mechanism outside of the housing as an obstacle to diffusion of a fluid out of the housing through the aperture; and
   forming a through-metallization passing through the external mechanism and penetrating into the housing through the aperture, at a distance away from edges of the aperture, in order to make contact with the metal device.

8. The method of claim 7, wherein the forming the housing comprises:
   forming a floor of the walls of a first one of the metallization levels;
   forming a cap of a second one of the metallization levels; and
   forming a plurality of sidewalls between the floor and the cap, wherein each of the sidewalls includes part of a third one of the metallization levels.

9. The method of claim 8, wherein forming the metal device comprises forming at least part of the metal device by a portion of the third one of the metallization levels.

10. The method of claim 7, further comprising forming an interconnect structure overlying the substrate, wherein the interconnect structure is formed of portions of the metallization levels separated by an insulating region.

11. The method of claim 7, wherein forming the through-metallization comprises forming a metal plate integral with the through-metallization.

12. The method of claim 11, wherein the wall of the housing in which the aperture is formed extends over at least three metallization levels and two via levels.

13. The method of claim 12, further comprising forming a bend in the metal plate in a lower metallization level of the metallization levels.

14. The method of claim 11, wherein forming the external mechanism comprises forming an external metal box integral with the wall of the housing in which the aperture is formed, wherein the external metal box contains the metal plate and includes a box aperture, the metal plate being located between the aperture in the wall and the box aperture, and wherein the through-metallization passes through the box aperture without making contact with metal walls of the box.

15. The method of claim 7, wherein the forming the external mechanism comprises forming a tunnel integral with the wall of the housing in which the aperture is formed, wherein the tunnel is at least partially filled with an insulating material and through which the at least one through-metallization passes.

16. The method of claim 15, wherein the forming the tunnel comprises forming the tunnel with a serpentine shape.

17. A method of forming a semiconductor device, the method comprising:
provingi a semiconductor substrate that includes a plurality of circuit elements disposed at a surface thereof;
forming an interconnect structure overlying the semiconductor substrate and electrically interconnecting ones of the circuit elements, wherein the interconnect structure comprises a number of metallization levels separated by an insulating region;
forming a housing overlying the substrate, the housing including walls formed from metal portions of the metallization levels;
forming an aperture located in a wall of the housing; and
forming a metal device housed in the housing, the metal device electrically connected to the interconnect structure, and formed overlying the substrate in a metallization level of the number of metallization levels.

18. The method of claim 17, further comprising forming an external mechanism outside of the housing configured to form an obstacle to diffusion of a fluid out of the housing through the aperture.

19. The method of claim 18, further comprising forming a through-metallization passing through the external mechanism and penetrating into the housing through the aperture, wherein the through-metallization electrically connects the metal device to the interconnect structure.

20. A method of fabricating a semiconductor device, the method comprising:
forming a plurality of circuit elements at a surface of a semiconductor substrate;
forming a first insulating layer over the plurality of circuit elements;
forming a first metallization layer on the first insulating layer;
patterning the first metallization layer to form a base for a housing;
forming a second insulating layer;
patterning the second insulating layer;
forming first vias in the second insulating layer, the first vias forming first portions of walls of the housing;
forming a second metallization layer on the second insulating layer;
pattering the second metallization layer to form a movable component of a microelectromechanical systems (MEMS) device and second portions of walls of the housing;
forming a third insulating layer;
patterning the third insulating layer;
forming second vias in the third insulating layer, the second vias forming third portions of walls of the housing;
forming a third metallization layer on the third insulating layer;
patterning the third metallization layer to form a lid for the housing, wherein
the lid includes holes, and
the movable component of the MEMS device is contained in the housing; and
performing a release etch to remove the second insulating layer and the third insulating layer within the housing such that the movable component of the MEMS device is free to move.

21. The method of claim 20, wherein the first vias, the second metallization layer, and the second vias are patterned in order to form an aperture in a wall of the housing.

22. The method of claim 21, further comprising forming an external mechanism outside of the housing configured to form an obstacle to diffusion of a fluid out of the housing through the aperture.

23. The method of claim 22, further comprising forming a through-metallization passing through the external mechanism and penetrating into the housing through the aperture, wherein the through-metallization is formed in the second metallization layer and electrically connects the movable component of the MEMS device to circuit elements of the plurality of circuit elements.

* * * * *